(12) United States Patent
In et al.

(10) Patent No.: US 8,049,570 B1
(45) Date of Patent: Nov. 1, 2011

(54) COUPLED BI-STABLE MICROCIRCUIT SYSTEM FOR ULTRA-SENSITIVE ELECTRICAL AND MAGNETIC FIELD SENSING

(75) Inventors: Visarath In, Chula Vista, CA (US); Patrick Longhini, San Diego, CA (US); Yong (Andy) An Kho, Chula Vista, CA (US); Joseph D. Neff, San Diego, CA (US); Antonio Palacios, San Diego, CA (US); Norman Liu, San Diego, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 22 days.

(21) Appl. No.: 12/732,023

(22) Filed: Mar. 25, 2010

Related U.S. Application Data

(63) Continuation-in-part of application No. 12/391,508, filed on Feb. 24, 2009, now Pat. No. 7,902,931, and a continuation-in-part of application No. 12/125,397, filed on May 22, 2008, now Pat. No. 7,777,535, and a continuation-in-part of application No. 11/755,601, filed on May 30, 2007, now Pat. No. 7,714,671.

(51) Int. Cl.
*H03K 3/03* (2006.01)
*G01R 33/00* (2006.01)

(52) U.S. Cl. .............. 331/57; 331/49; 331/74; 331/172; 324/227; 324/260

(58) Field of Classification Search .................... 331/46, 331/49, 55–57, 74, 108 R, 172; 324/207.16, 324/227, 244, 260, 326, 327
See application file for complete search history.

(56) References Cited

U.S. PATENT DOCUMENTS

| | | | |
|---|---|---|---|
| 6,222,423 B1 * | 4/2001 | Sudjian | 331/57 |
| 6,880,400 B1 | 4/2005 | Fogliatti et al. | |
| 7,109,918 B1 | 9/2006 | Meadows et al. | |
| 7,196,590 B1 | 3/2007 | In et al. | |
| 7,420,366 B1 | 9/2008 | In et al. | |
| 7,528,606 B1 | 5/2009 | In et al. | |

OTHER PUBLICATIONS

In, Visarath et al., Coupling-Induced Oscillations in Overdamped Bistable Systems, Physical Review E., 68, 045102 (R), 2003.

(Continued)

*Primary Examiner* — Robert Pascal
*Assistant Examiner* — Levi Gannon
(74) *Attorney, Agent, or Firm* — Ryan J. Friedl; Kyle Eppele

(57) ABSTRACT

An electrical/magnetic current sensing system includes a first collection mechanism configured to convert an electric field into surface charge, a second collection mechanism comprising a magnetic reactive material, and a sensor coupled to the first and second collection mechanisms. The sensor comprises an odd number, greater than or equal to three, of unidirectionally-coupled non-linear over-damped bi-stable elements. Each element comprises a resistive load, an operational transconductance amplifier (OTA) with a bipolar junction transistor differential pair, a cross-coupled OTA, and a non-linear OTA. Each element may comprise fully differential inputs and outputs. The sensor may be contained in a microchip or on a printed circuit board. A resident time difference readout device may be connected to the sensor, and may be configured to perform a power spectral density calculation. The sensor may include a resistance to voltage circuit connected between the second collection mechanism and the elements.

19 Claims, 7 Drawing Sheets

OTHER PUBLICATIONS

Bulsara, Adi et al., Emergent Oscillations in Unidirectionally Coupled Overdamped Bistable Systems, Physical Review E, 70, 036103, 2004.

In, Visarath et al., Complex Behavior in Driven Unidirectionally Coupled Overdamped Duffing Elements, Physical Review E, 73, 066121, 2006.

In, Visarath et al, Complex Dynamics in Unidirectionally Coupled Overdamped Bistable Systems Subject to a Time-Periodic External Signal, Physical Review E 72, 04510R, 2005.

Longhini, Patrick et al., Exploiting Dynamical Symmetry in Coupled Nonlinear Elements for Efficient Frequency Down-Conversion, Physical Review E, 76, 02620, 2007.

* cited by examiner

COUPLED BI-STABLE MICROCIRCUIT SYSTEM FOR ULTRA-SENSITIVE ELECTRICAL AND MAGNETIC FIELD SENSING

CROSS-REFERENCES TO RELATED APPLICATIONS

This application is a continuation-in-part of commonly-assigned U.S. application Ser. No. 11/755,601, filed May 30, 2007, now U.S. Pat. No. 7,714,671 entitled "Wideband Non-Linear Channelizer for Rapid Processing of Static and Time-Varying Signals," commonly-assigned U.S. application Ser. No. 12/125,397, filed May 22, 2008, now U.S. Pat. No. 7,777,535 entitled "Coupled Non-Linear Elements for Frequency Down-Conversion Systems and Methods," and commonly-assigned U.S. application Ser. No. 12/391,508, filed Feb. 24, 2009, now U.S. Pat. No. 7,902,931 entitled "Wideband Non-Linear Circuits for Implementation in Frequency Channel Separation," the entire content each application fully incorporated by reference herein.

FEDERALLY SPONSORED RESEARCH AND DEVELOPMENT

The Coupled Bi-Stable Microcircuit System for Ultra-Sensitive Electrical and Magnetic Field Sensing is assigned to the United States Government and is available for licensing for commercial purposes. Licensing and technical inquiries may be directed to the Office of Research and Technical Applications, Space and Naval Warfare Systems Center, Pacific, Code 2112, San Diego, Calif., 92152; voice (619) 553-2778; email ssc_pac_T2@navy.mil. Reference Navy Case No. 100178.

BACKGROUND

Electrical and magnetic field sensors are used for a variety of applications, such as the detection and ranging of ships and other vehicles, oceanographic studies, and geophysical measurements and prospecting. Most devices, however, generally only detect one of either the electrical field or the magnetic field. The devices that do detect both fields are quite bulky and expensive to manufacture. Thus, a need exists for a compact, inexpensive, and easy to manufacture system that is capable of simultaneously detecting both electric and magnetic fields.

DETAILED DESCRIPTION OF SOME EMBODIMENTS

Figure 1:
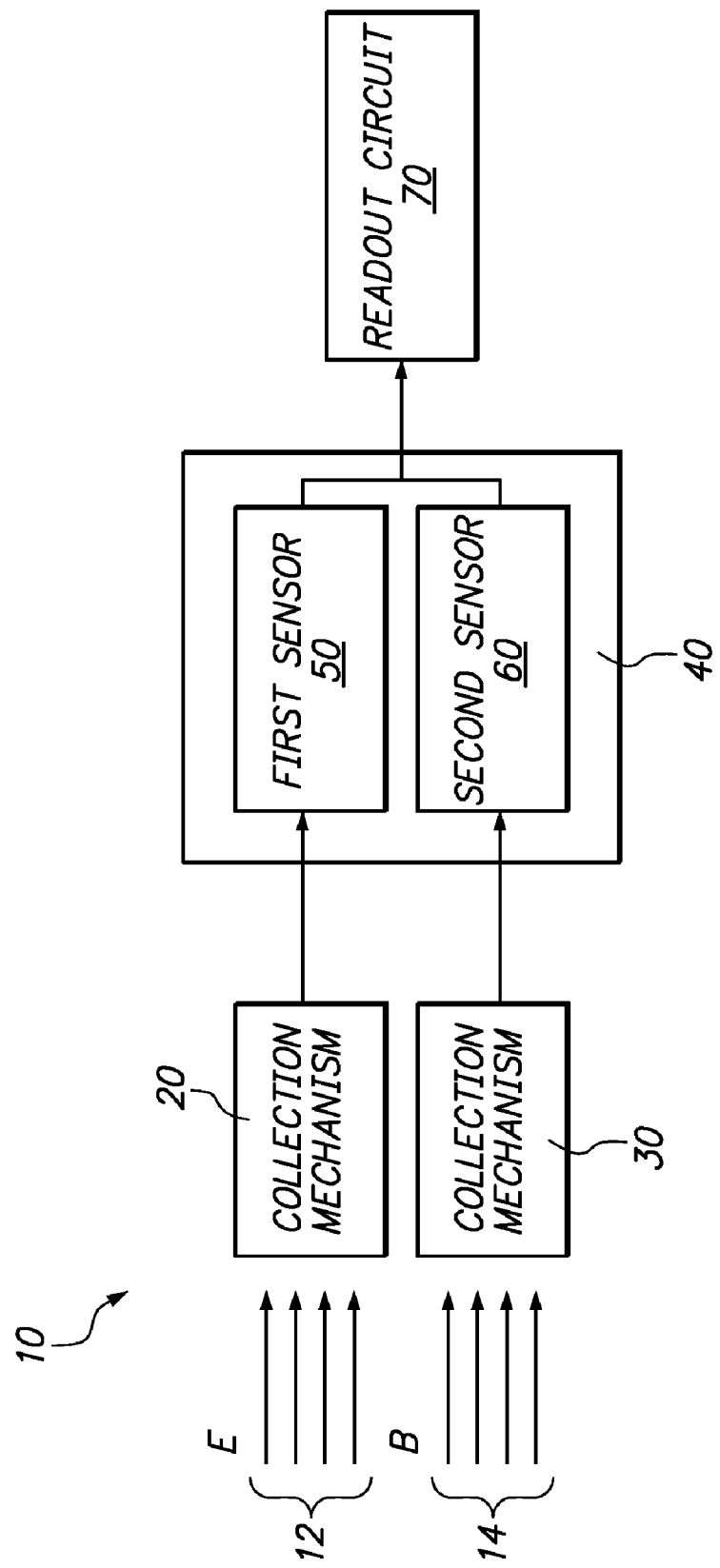
FIG. 1 shows a block diagram of an embodiment of a system in accordance with the Coupled Bi-Stable Microcircuit System for Ultra-Sensitive Electrical and Magnetic Field Sensing.

FIG. 1 shows a diagram of an embodiment of a system 10 in accordance with the Coupled Bi-Stable Microcircuit System for Ultra-Sensitive Electrical and Magnetic Field Sensing. System 10 includes a first collection mechanism 20, a second collection mechanism 30, and a sensor 40 connected to first collection mechanism 20 and second collection mechanism 30, and a readout circuit 70 connected to sensor 40.

First collection mechanism 20 is comprised of a conductive material such as copper, aluminum, gold, and silver, and is configured to convert an electric field 12 into surface charge. Second collection mechanism 30 comprises a magnetic reactive material, such as an anisotropic magneto-resistance material, and is configured to detect a magnetic field 14. Any size and shape of collection mechanism 20 may used to detect electrical field 12, depending upon the application requirement. In some embodiments, collection mechanism 20 is shaped as a plate. However, the sensitivity of first sensor 50 may depend in part on the area of collection mechanism 20, where a larger collection mechanism can discern smaller field changes and therefore provide a more sensitive instrument.

Figure 2:
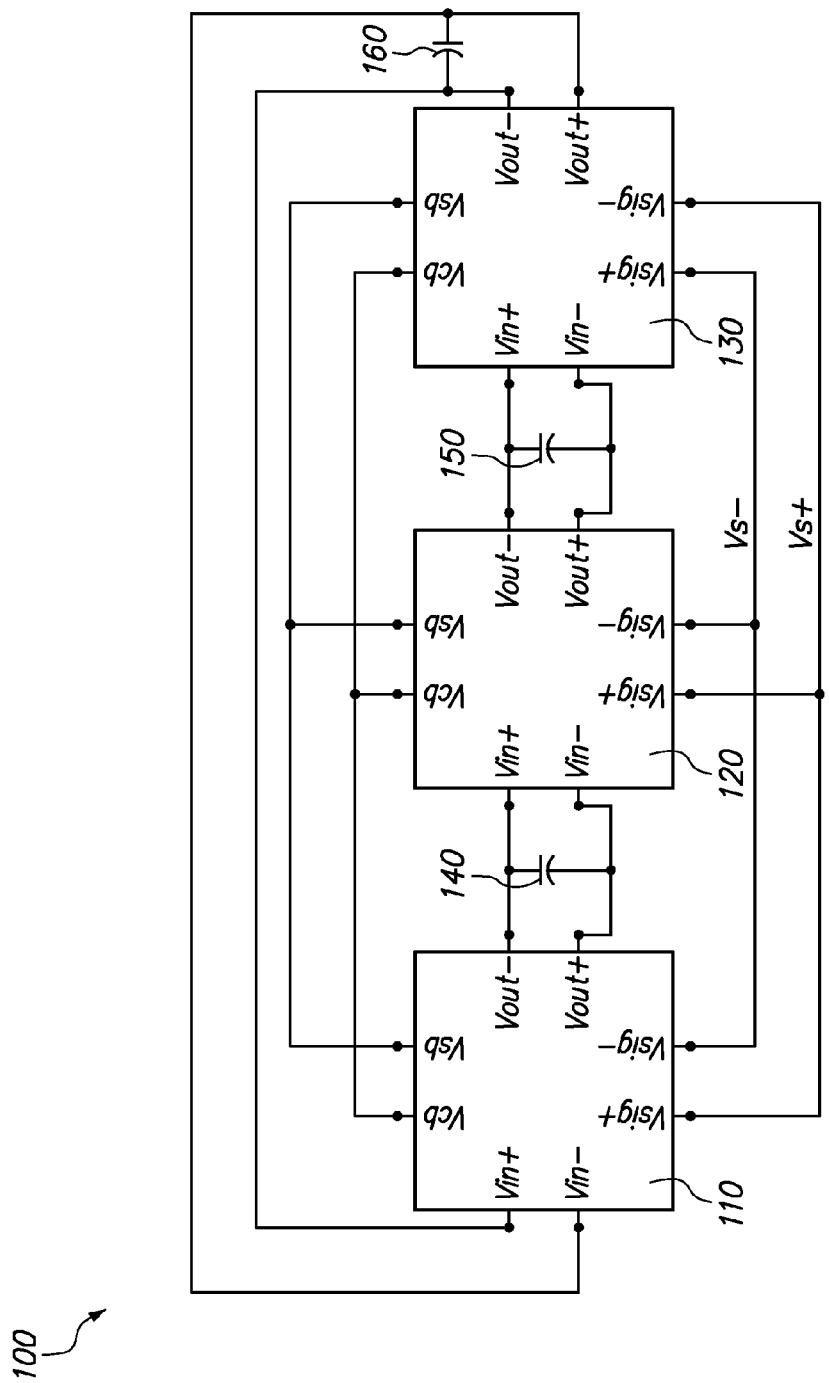
FIG. 2 shows a schematic diagram of an embodiment of a microcircuit sensor in accordance with the Coupled Bi-Stable Microcircuit System for Ultra-Sensitive Electrical and Magnetic Field Sensing.
Figure 3:
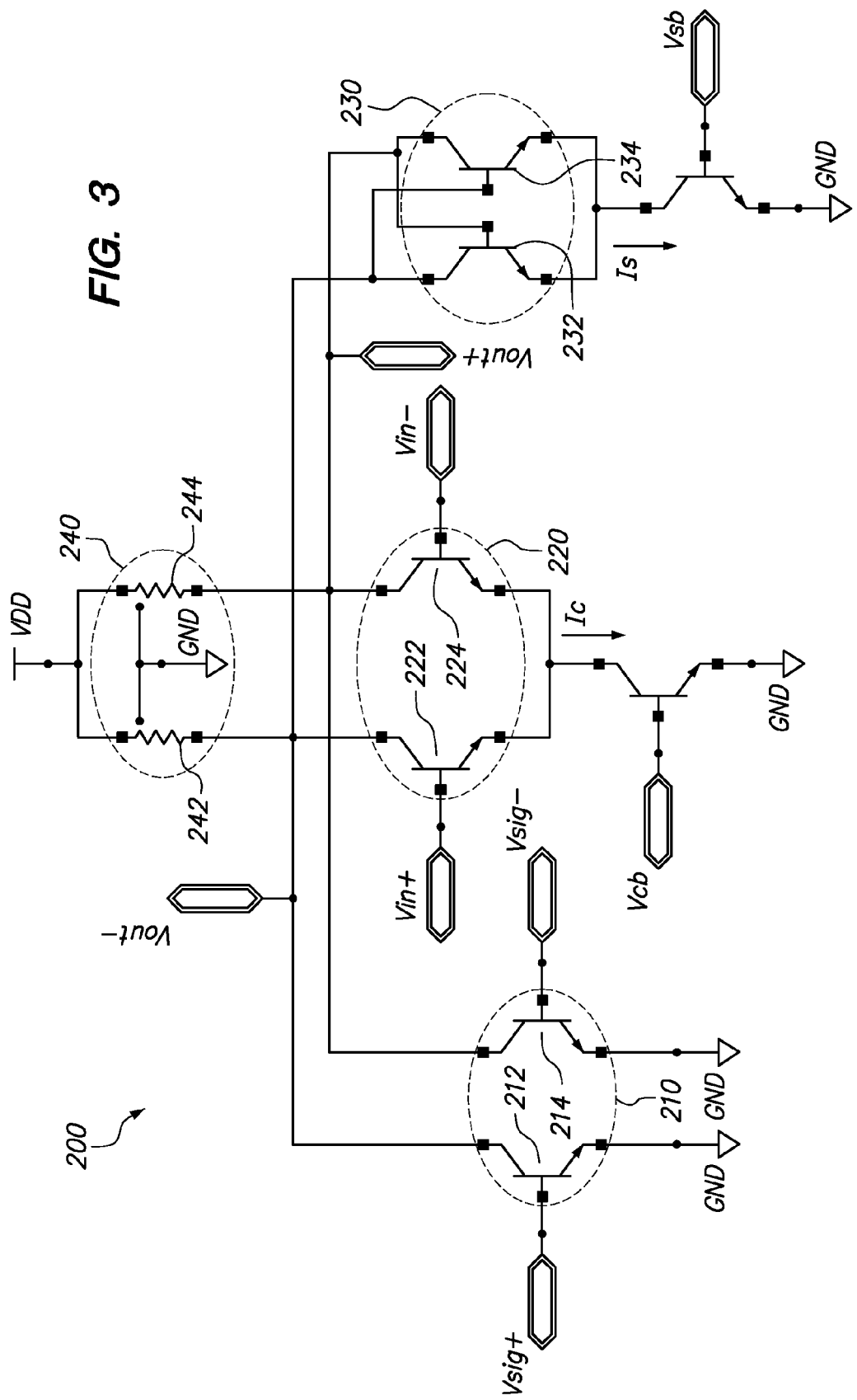
FIG. 3 shows a schematic diagram of an embodiment of a sensor element in accordance with the Coupled Bi-Stable Microcircuit System for Ultra-Sensitive Electrical and Magnetic Field Sensing.

Sensor 40 comprises a first sensor 50 and a second sensor 60. First sensor 50 and second sensor 60 each comprise an odd number, greater than three, of unidirectionally-coupled non-linear over-damped bi-stable elements, as shown in FIG. 2. Each of the elements may comprise an operational transconductance amplifier (OTA), a coupling OTA, and a non-linear OTA, as shown in FIG. 3. In some embodiments, sensor 40 may be contained in a microchip. In other embodiments, sensor 40 may be formed on a printed circuit board. In some embodiments, sensor 40 may contain many sensors on the either on microchip or printed circuit board to read different directions of the fields such as reading x-, y- and z-component of the fields.

Readout circuit 70 may be configured to provide a residence time difference (RTD) readout for sensor 40. In some embodiments, readout circuit 70 is configured, via the appropriate software, to perform a power spectral density calculation.

System 10 is configured to detect a weak (small) electrical current. The operating principle is based on the generation of internal oscillations in coupled non-linear dynamic systems that, absent the coupling, do not normally oscillate. System 10 may be used to detect and/or quantify very weak dc and time-periodic target electric field signals depending upon how it is configured for a specific application.

The system dynamics for DC and AC signals are different. For a DC signal, the system behaves with consistent oscillations where the amplitude is constant but the frequency and duty cycle is skewed in proportion to the magnitude of the DC field. The residence time difference (RTD) readout strategy may be used to discern the signal. For low frequency (AC) signal, a power spectral density (PSD) method may be used to discern the signal amplitude and frequency.

First sensor 50 is configured to detect minute electrical current changes at the input port. The input can be any electrical current source. The input port is connected to collection mechanism 20 to convert external electric field 12 into surface charge, governed by the physics of field-conductor interaction. Once the surface charged is induced by the field, a small amount of current flows into first sensor 50 in the process of equalizing the electrical potential of the collecting mechanism 20, and its magnitude is then read.

The magnetic field sensing system is similarly configured as the electrical field sensing system, except that collection mechanism 30 comprises a magnetic reactive material. Examples of such material include Giant Magneto-Resistance (GMR) material and Anisotropic Magneto-Resistance (AMR) material. Further, collection mechanism 30 is much smaller than collection mechanism 20. The typical size of collection mechanism 30 using an AMR material, for example, is about 100 micrometer square (cross area of a human hair). Also, the magnetic field to material interaction physics is different than the one described for the electric field sensing. In this situation, the interaction produces a change in the electrical resistance characteristics of the material. For sensing, a resistance to voltage circuit, such as a Wheatstone bridge, is used to connect collection mechanism 30 to second sensor 60. When magnetic field 14 is present, the resistance of the material of collection mechanism 30 is changed. This change results in a voltage change that may then be measured by second sensor 60.

System 10 may be configured to sense different levels of input AC and DC signals by tuning system parameters. System 10 may be tuned to operate in a low Hz to GHz range. Further, system 10 is fully-differential, which gives it the inherently high immunity to common-mode noise. Also, system 10 may be designed and fabricated in a chip with the standard microchip fabrication technology which makes it very inexpensive, compact, high reliability, and can operate in extreme temperatures (environment) −40° C. to 120° C. In addition, system 10 does not use or depend on exotic ferroelectric material to act as the amplifying agent for the input signal.

System 10 further operates in current mode instead of voltage mode, which means that the signal from the collecting mechanism can be input directly into the sensing mechanism without additional conversion to voltage via nonlinear capacitors or other media. Also, system 10 is extremely sensitive to an input signal, as compared to existing technologies (current state of the art). The design can be configured to operate in either voltage mode or current mode with a very slight modification to the basic circuitry. The design also optimizes on the features of the transistors and other electrical components to enhance overall system sensitivity.

FIG. 2 shows schematic diagram of an embodiment of a microcircuit sensor 100 in accordance with the Coupled Bi-Stable Microcircuit System for Ultra-Sensitive Electrical and Magnetic Field Sensing. As an example, first sensor 50 and second sensor 60 may be configured identically or similarly to sensor 100. Sensor 100 comprises an odd number, greater than or equal to three, of unidirectionally-coupled non-linear over-damped bi-stable elements. As shown in FIG. 2, sensor 100 contains three elements, 110, 120, and 130.

Each element 110, 120, and 130 may be described by an over-damped bi-stable system containing the hyperbolic tangent function as the non-linear term, which results from using an operational transconductance amplifier (OTA) to perform this function. The entire dynamics is derived from Kirchoffs junction law at the output nodes, $V_{o1+}$ and $V_{o1-}$, shown in FIG. 3, and it is given as $$C_L * dV_{o1}/dt = -gV_{o1} + I_s \tan h(\beta_s V_{i1}) \quad (1)$$

where g, $I_s$ and $\beta_s$ control the bi-stability of the energy function of the subunit. g, or $1/R_L$, is a linear conductance, $C_L$ is the total parasitic capacitance at the output node, $V_{i1}$ is the differential voltage input of the subunit (i.e. $V_{i1}=V_{i1+}-V_{i1-}$), and $V_{o1}$ is the differential voltage output of the subunit (i.e. $V_{o1}=V_{o1+}-V_{o1-}$). When three elements are unidirectionally coupled, the following equations describe the dynamical behavior of the sensor system, $$C_L * \dot{V}_1 = -gV_1 - I_c \tan h(\beta_c * V_3) + I_s \tan h(\beta_s * V_1) + \epsilon_{in}$$

$$C_L * \dot{V}_2 = -gV_2 = I_c \tan h(\beta_c * V_1) + I_s \tan h(\beta_s * V_2) + \epsilon_{in}$$

$$C_L * \dot{V}_3 = \times g V_3 \times I_c \tan h(\beta_c * V_2) + I_s \tan h(\beta_s * V_3) + \epsilon_{in} \quad (2)$$

where $V_i$ represents voltage output of the $i^{th}$ element in a unidirectionally coupled 3-element sensor, $I_c$ and $I_s$ are bias currents which control the non-linear terms in the system, $\beta_c$ and $\beta_s$ are device parameters, and $\epsilon_{in}$ is the external current input signal.

The input for the last element (equation) is opposite to the other two elements in the ring to take advantage of the enhanced asymmetry in the oscillation characteristic, mainly the duty cycle difference of the oscillations. This, in turn, enhances the sensitivity of the sensing system. Further, each of the sensor elements may include fully differential inputs and outputs, as shown in FIG. 3.

FIG. 2 also shows capacitors that may be connected between each of the sensor elements. Capacitor 140 is connected between first element 110 and second element 120, capacitor 150 is connected between second element 120 and third element 130, and capacitor 160 is connected between third element 160 and first element 110. Capacitors 140, 150, and 160 may be off-chip capacitors, in embodiments where sensor 40 is contained in a microchip. Capacitors 140, 150, and 160, each of the value $C_L/2$, where $C_L$ is the capacitance value in equation 2, are connected across each of differential outputs. The input nodes (shown in FIG. 3), $V_{sig+}$ and $V_{sig-}$, from each element are tied together in the way shown in FIG. 2. For one of the elements, the connection of the two nodes is reversed to fit the sign reversal of the last equation in equation 2, to make the circuit more sensitive.

FIG. 3 shows a schematic diagram of an embodiment of a sensor element 200 in accordance with the Coupled Bi-Stable Microcircuit System for Ultra-Sensitive Electrical and Magnetic Field Sensing. Sensor element 200 includes an OTA 210 including NPN bipolar junction transistors (BJTs) 212 and 214, a coupling OTA 220 with BJTs 222 and 224, a non-linear OTA 230 with BJTs 232 and 234, and a resistive load 240 including resistors 242 and 244. Transistors 212 and 214 may be used as part of a circuit for receiving an external input.

Figure 4:
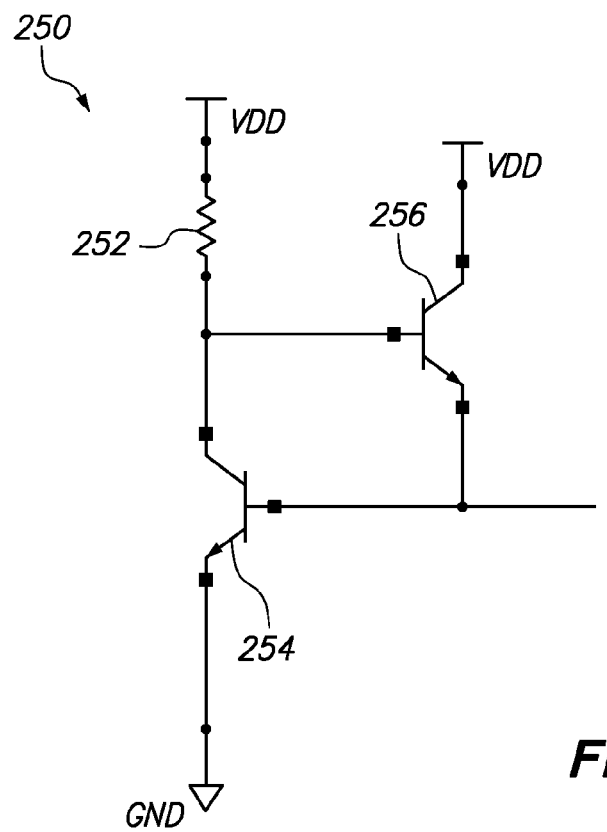
FIG. 4 shows a schematic diagram of an embodiment of a biasing circuit for providing the tail current of the operational transconductance amplifier in accordance with the Coupled Bi-Stable Microcircuit System for Ultra-Sensitive Electrical and Magnetic Field Sensing.

Tail currents $I_c$ and $I_s$ from OTA 220 and OTA 230, respectively, can be set by using a biasing circuit 250 shown in FIG. 4. For each element, there may be one copy of biasing circuit 250 for each of the two tail currents. Referring to FIG. 4, biasing circuit 250 may include resistor 252 and NPN transistors 254 and 256. The base of NPN transistor 254 of each copy is connected to either node $V_{cb}$ or $V_{sb}$ (shown in FIG. 3) of each element. Resistor 252 may be an off-chip resistor, which can be replaced by a variable resistor, to set the value of each tail current in the following way: $I \approx (V_{dd} - 2*V_{be})/R_c$, where $V_{dd}$ is the supply voltage, $V_{be}$ is the forward-biased voltage of the base-emitter junction of NPN transistors 254 and 256 (assuming they have the same $V_{be}$), and $R_c$ is the value of resistor 252.

Referring back to FIG. 3, each of two hyperbolic tangent terms in equation 2 can be realized by an OTA with BJT differential pair, such as OTAs 220 and 230. The linear conductance in equation 2 can be realized by using a pair of resistors as the load of the differential pair, such as resistors 242 and 244 of load 240. Further, each sensor element is fully differential (i.e. differential input to differential output) which has a good immunity to common-mode noise. Also, this means that in Eq. 2, $V_i$ stands for the differential voltage output of the $i^{th}$ element.

Figure 5:
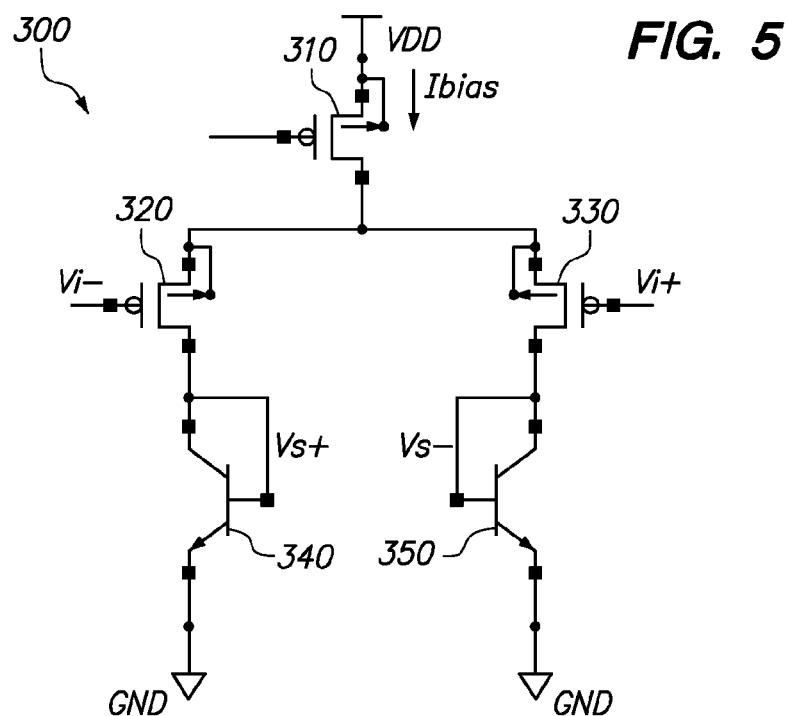
FIG. 5 shows a schematic diagram of an embodiment of a circuit configuration of an input differential pair of a sensor element in accordance with the Coupled Bi-Stable Microcircuit System for Ultra-Sensitive Electrical and Magnetic Field Sensing.

FIG. 5 shows a schematic diagram of an embodiment of a circuit configuration 300 of an input differential pair of a sensor element in accordance with the Coupled Bi-Stable Microcircuit System for Ultra-Sensitive Electrical and Magnetic Field Sensing. Circuit 300 includes MOSFET transistors 310, 320, and 330, as well as NPN BJT transistors 340 and 350. The nodes $V_{s+}$ and $V_{s-}$ in FIG. 5 are tied to $V_{s+}$ and $V_{s-}$ respectively, shown in FIG. 2. The tail current, $I_{bias}$, of the differential pair (or the current through transistor 310) can be provided by biasing the gate of transistor 310 externally or by using a bias generator on-chip.

Circuit configuration 300 is configured to deal with very small electrical signals. As such, the external current input (differential) signal $\epsilon_{in}$ is equal to $g_m*(V_{i+}-V_{i-})$, where $g_m$ is the small-signal transconductance of transistor 320. In this circuit, $g_m$ is equal to $(\mu_p*C_{ox}*W/L*I_{bias})^{1/2}$, where $\mu_p$ is the electron hole mobility of transistor 320, $C_{ox}$ is the intrinsic MOS oxide capacitance, W is the width, and L is the length of transistor 320.

In the configuration where the circuit is used to detect a small current caused by a change in electric field, $V_{i+}$ is tied to ground and is tied to an off-chip diode-connected NPN transistor. If $I_{dc}$ is the input current flowing through the diode-connected transistor, then $I_{dc} = I_{so}*(\exp(V_{i-}/V_T)-1)$, where $I_{so}$ is the reverse saturation current of the diode-connected NPN transistor, and $V_T$ is the thermal voltage, which is about 26 mV at room temperature. For $V_{i-}/V_T \ll 1 \Rightarrow I_{dc} \approx I_{so}*V_{i-}/V_T$ and that means $V_{i-} \approx V_T*(I_{dc}/I_{so})$ and $\epsilon_{in} \approx g_m V_T*(I_{dc}/I_{so})$. $I_{so}$ usually is in the order of a few femto-amperes to a few pico-amperes (depending on transistors). As such, circuit configuration 300 may be used to detect current at least at that order of magnitude. In the configuration where the circuit is used to detect a change in magnetic field using GMR or AMR material, $V_{i+}$ and $V_{i-}$ can be connected to the differential voltage output of an off-chip Wheatstone bridge circuit.

The top-level system schematic for a three-element sensor is shown in FIG. 2. The load circuit in FIG. 2 includes of a load capacitor with the value $C_L$ connecting each node to ground. The value of $C_L$ is chosen such that it is greater than the total parasitic capacitance $C_P$ at that node (i.e., $C_L \gg 10*C_P$). Equation 2 may describe the underlying dynamics of a coupled bi-stable system, such as that realized by the microelectronic circuitry shown in FIG. 2.

Figure 6:
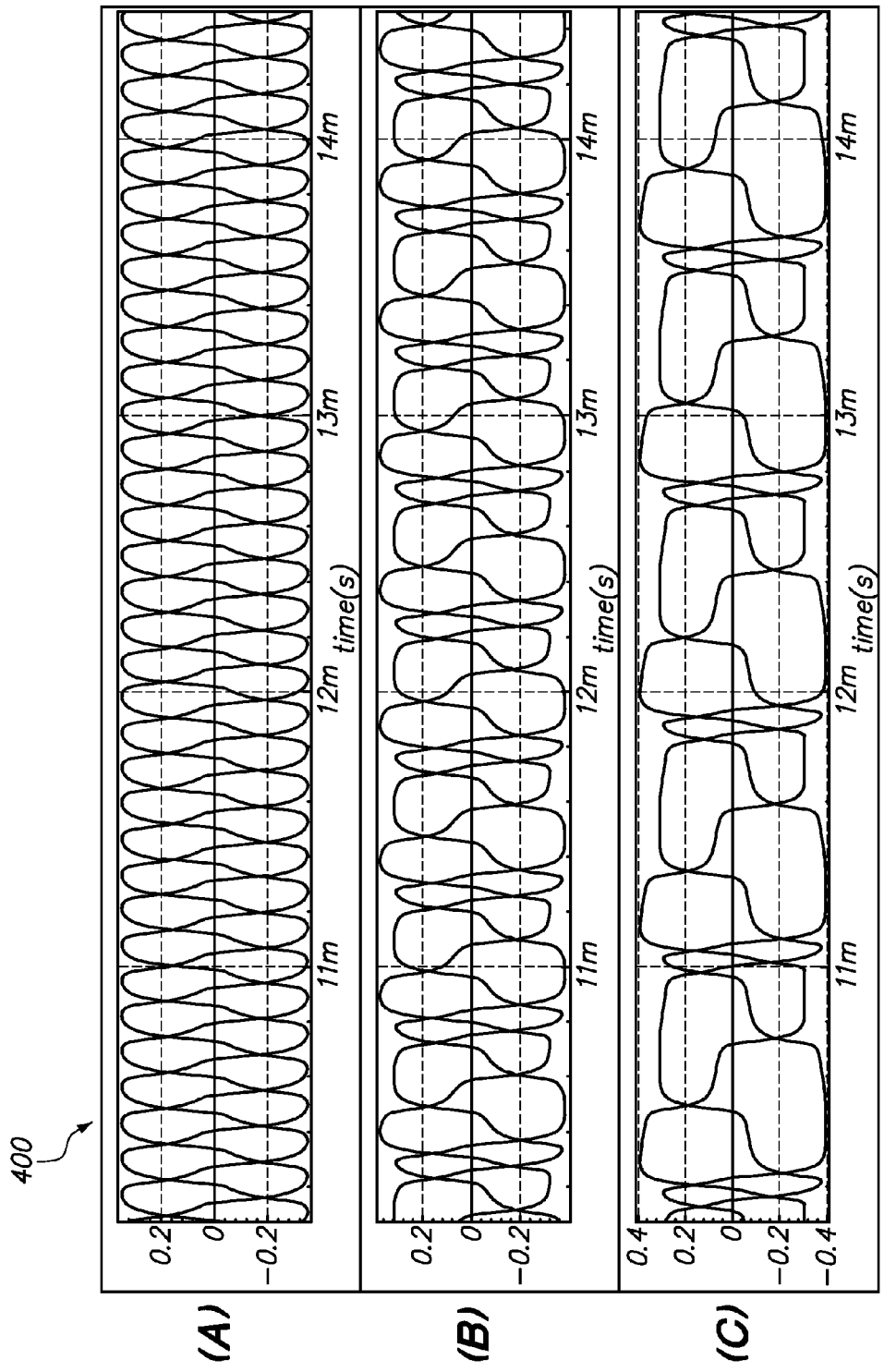
FIG. 6 shows a graph illustrating a transient analysis simulation for three different input current values, for a system in accordance with the Coupled Bi-Stable Microcircuit System for Ultra-Sensitive Electrical and Magnetic Field Sensing.

FIG. 6 shows a graph 400 illustrating a transient analysis simulation for three different input current values, for a system in accordance with the Coupled Bi-Stable Microcircuit System for Ultra-Sensitive Electrical and Magnetic Field Sensing. Graph 400 shows simulation results for a sensor having three unidirectionally coupled elements, using three different values of input current to mimic the current inputs from collection mechanism 20 or 30 in FIG. 1. The parameters are $I_c$=150 uA, $I_s$=200 uA, $g$=$\frac{1}{1000}\Omega^{-1}$, $g_m$=0.17 mA/V, and $C_L$=20 nF. FIG. 6A shows results using an input current of 0 pA, FIG. 6B shows results using an input current of 1.5 pA, and FIG. 6C shows results using an input current of 2.5 pA. The graphs illustrate that with the increase of input current, the duty cycle of the differential outputs above zero decreases and below zero increases. Further, the three graphs show that as the input current increases, the frequency of oscillation decreases. A residence time difference (RTD) method could be used to detect the change in current due to the dramatic change in duty cycle. RTD is the time difference between the negative cycle time and the positive cycle time.

Figure 7:
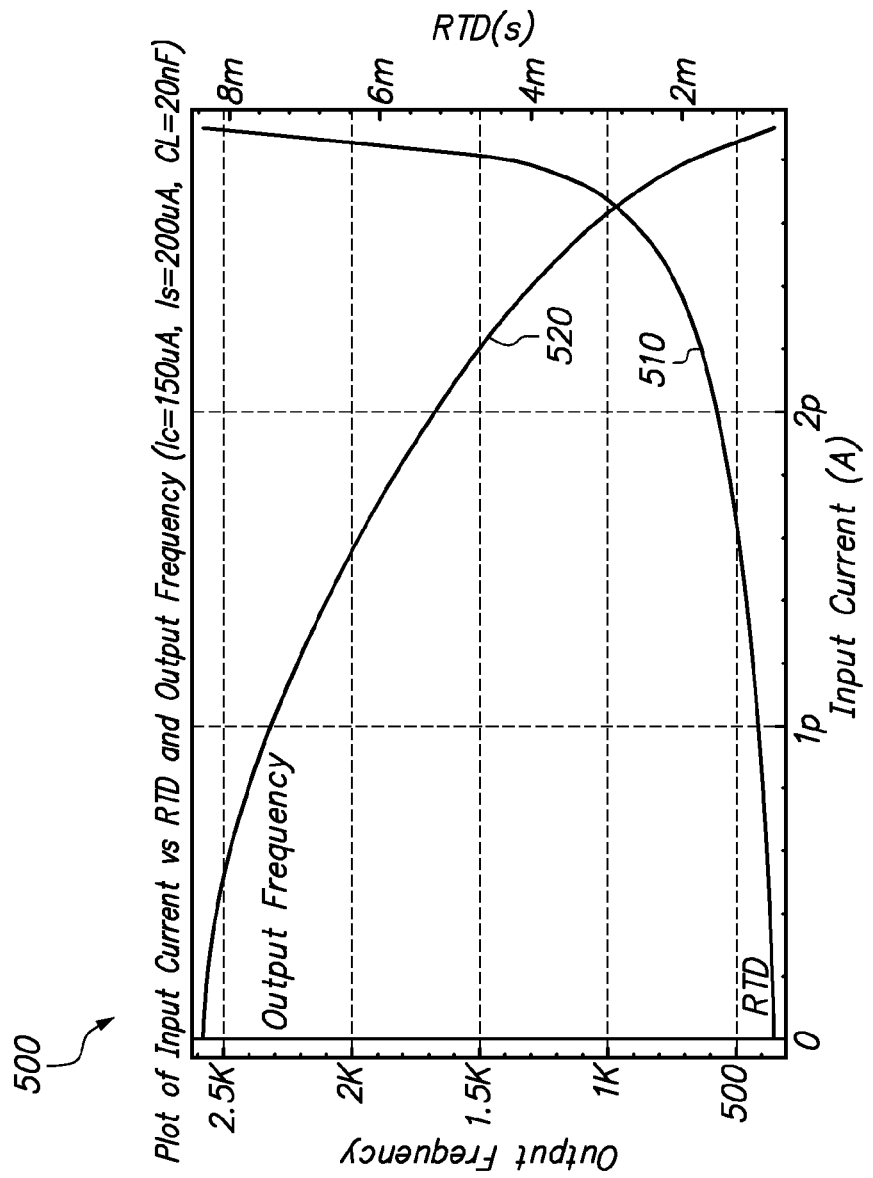
FIG. 7 shows a graph illustrating residence time difference and output frequency values versus input current, for a system in accordance with the Coupled Bi-Stable Microcircuit System for Ultra-Sensitive Electrical and Magnetic Field Sensing.

FIG. 7 shows a graph 500 illustrating residence time difference and output frequency values versus input current, for a system in accordance with the Coupled Bi-Stable Microcircuit System for Ultra-Sensitive Electrical and Magnetic Field Sensing. As shown, line 510 represents the RTD values and line 520 represents output frequency. FIG. 10 shows that RTD increases along with the increase in input current. The slope of the response cure indicates the sensitivity of the instrument, where the steeper the slope, the more sensitive the instrument.

Figure 8:
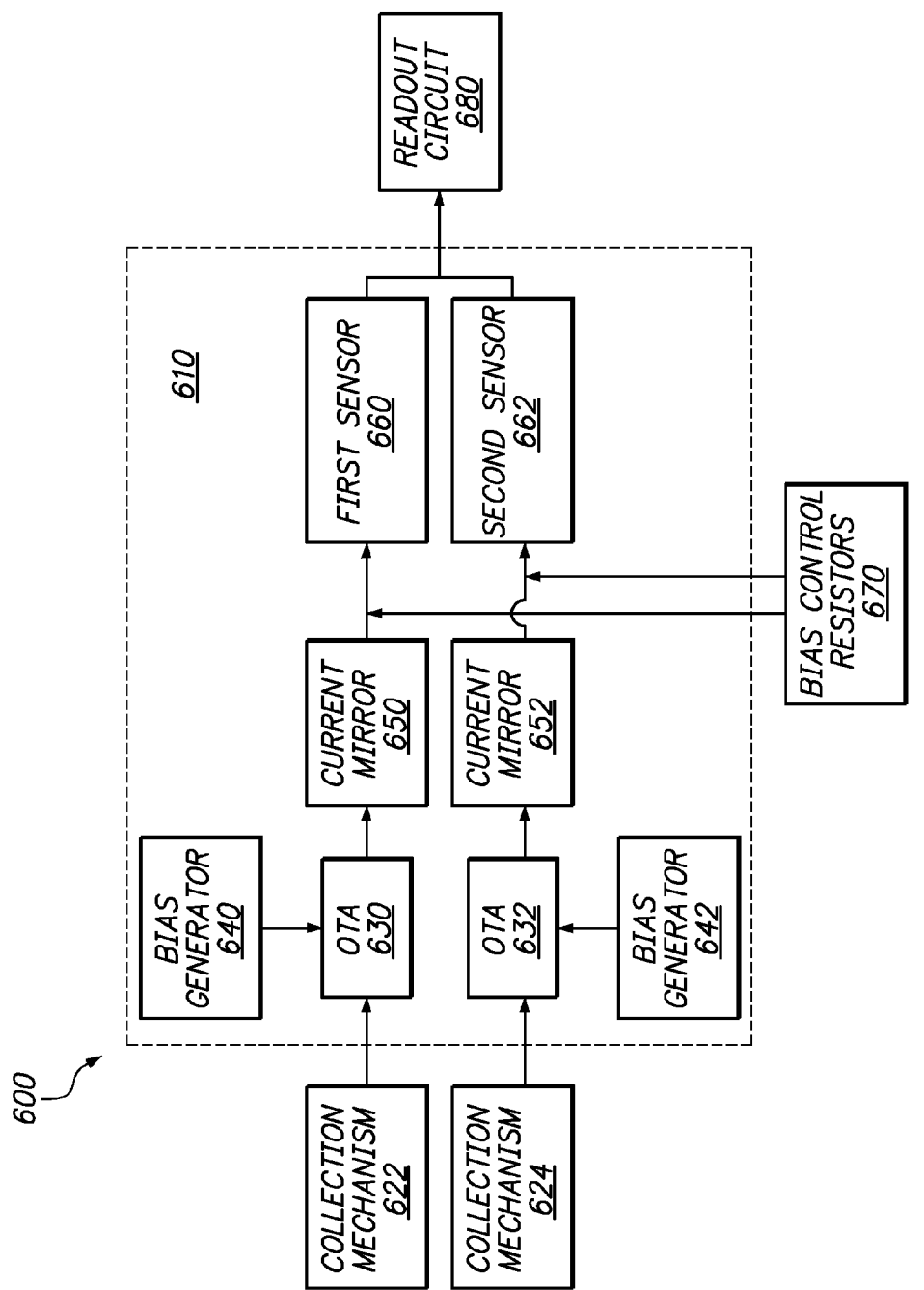
FIG. 8 shows a block diagram of another embodiment of a system in accordance with the Coupled Bi-Stable Microcircuit System for Ultra-Sensitive Electrical and Magnetic Field Sensing.

FIG. 8 shows a block diagram of another embodiment of a system 600 in accordance with the Coupled Bi-Stable Microcircuit System for Ultra-Sensitive Electrical and Magnetic Field Sensing. System 600 may include several components located within a microchip 610, and other components contained on a printed circuit board. As shown, system 600 includes collection mechanisms 622 and 624, OTAs 630 and 632, bias generators 640 and 642, current mirrors 650 and 652, first sensor 660 and second sensor 662, bias control resistors 670, and readout circuit 680. Collection mechanisms 622 and 624, bias control resistors 670, and readout circuit 680 may be located outside of microchip 610.

Collection mechanism 622 may be configured similarly to collection mechanism 20 of FIG. 1, while collection mechanism 624 may be configured similarly to collection mechanism 30 of FIG. 1. OTAs 630 and 632 may serve to condition the input current so that it can be efficiently read by the current mirror. Bias generators 640 and 642 may be used to bias the OTAs so that they are operating in the correct regime. Current mirrors 650 and 652 may be used to copy the input current to all three elements of the sensor. First sensor 660 may be used to detect an electrical field and may be configured similarly to first sensor 50 of FIG. 1. Second sensor 662 may be used to detect a magnetic field and may be configured similarly to second sensor 60 of FIG. 1. Bias control resistors 670 serve to adjust the frequency of oscillation and tune the sensitivity of the device. Readout circuit 680 may be configured similarly to readout circuit 70 of FIG. 1.

Many modifications and variations of the Coupled Bi-Stable Microcircuit System for Ultra-Sensitive Electrical and Magnetic Field Sensing are possible in light of the above description. Within the scope of the appended claims, the embodiments of the systems described herein may be practiced otherwise than as specifically described. The scope of the claims is not limited to the implementations and the embodiments disclosed herein, but extends to other implementations and embodiments as may be contemplated by those having ordinary skill in the art.

We claim:

1. A system comprising:
    a first and a second sensor, each sensor comprising an odd number, greater than or equal to three, of unidirectionally-coupled non-linear over-damped bi-stable elements, each element comprising a resistive load connected to an operational transconductance amplifier (OTA) with a bipolar junction transistor differential pair, a cross-coupled OTA, and a current input OTA;
    a first collection mechanism, connected to the first sensor, configured to convert an electric field into surface charge; and
    a second collection mechanism, connected to the second sensor, comprising a magnetic reactive material.

2. The system of claim 1, wherein the first collection mechanism comprises a conductive material selected from the group of conductive materials consisting of copper, aluminum, gold, and silver, and wherein the magnetic reactive material is an anisotropic magneto-resistance material.

3. The system of claim 1, wherein an element of the first sensor and an element of the second sensor are each configured to receive both a symmetrical and an asymmetrical input signal.

4. The system of claim 1 further comprising a readout device connected to the first sensor and the second sensor.

5. The system of claim 4, wherein the readout device is configured to perform a resident time difference calculation and a power spectral density calculation.

6. The system of claim 1, wherein the second sensor further comprises a resistance to voltage circuit connected between the second collection mechanism and the elements of the second sensor.

7. The system of claim 1 further comprising a first input current mirror connected to the outputs of each of the first sensor elements and a second input current mirror connected to the outputs of each of the second sensor elements.

8. The system of claim 1, wherein the first sensor and the second sensor are described by the equations $$C_L * \dot{V}_1 = -gV_1 - I_c \tan h(\beta_c * V_3) + I_s \tan h(\beta_s * V_1) + \epsilon_{in}$$

$$C_L * \dot{V}_2 = =gV_2 = I_c \tan h(\beta_c * V_1) + I_s \tan h(\beta_s * V_2) + \epsilon_{in}$$

$$C_L * \dot{V}_3 = \times gV_3 \times I_c \tan h(\beta_c * V_2) + I_s \tan h(\beta_s * V_3) + \epsilon_{in} \quad (2)$$

where $V_i$ represents voltage output of the $i^{th}$ element in the first sensor and the second sensor, $I_c$ and $I_s$ are bias currents which control the non-linear terms in the system, $\beta_c$ and $\beta_s$ are device parameters, and $\epsilon_{in}$ is an external current input signal.

9. The system of claim 1, wherein the first sensor and the second sensor are configured to be tuned to operate in a frequency range of between about 100 Hz and about 3 GHz.

10. The system of claim 1, wherein the first sensor and the second sensor are formed on a printed circuit board.

11. The system of claim 1, wherein the current input OTA is configured to input both alternating current and direct current.

12. A system comprising:
    a first collection mechanism configured to convert an electric field into surface charge;
    a second collection mechanism comprising a magnetic reactive material;
    a first sensor connected to the first collection mechanism and a second sensor connected to the second collection mechanism, the first sensor and the second sensor comprising an odd number, greater than three, of unidirectionally-coupled non-linear over-damped bi-stable elements, wherein each element comprises a resistive load connected to an operational transconductance amplifier (OTA) with a bipolar junction transistor differential pair, a cross-coupled OTA, and a current input OTA, the first sensor and the second sensor configured to be tuned to operate in a frequency range of between about 100 Hz and about 3 GHz; and
    a readout device connected to the first sensor and the second sensor.

13. The system of claim 12, wherein the first sensor and the second sensor are described by the equations $$C_L * \dot{V}_1 = -gV_1 - I_c \tan h(\beta_c * V_3) + I_s \tan h(\beta_s * V_1) + \epsilon_{in}$$

$$C_L * \dot{V}_2 = =gV_2 = I_c \tan h(\beta_c * V_1) + I_s \tan h(\beta_s * V_2) + \epsilon_{in}$$

$$C_L * \dot{V}_3 = \times gV_3 \times I_c \tan h(\beta_c * V_2) + I_s \tan h(\beta_s * V_3) + \epsilon_{in} \quad (2)$$

where $V_i$ represents voltage output of the $i^{th}$ element in the first sensor and the second sensor, $I_c$ and $I_s$ are bias currents which control the non-linear terms in the system, $\beta_c$ and $\beta_s$ are device parameters, and $\epsilon_{in}$ is an external current input signal.

14. The system of claim 12, wherein the first collection mechanism comprises a conductive material selected from the group of conductive materials consisting of copper, aluminum, gold, and silver, and the magnetic reactive material is an anisotropic magneto-resistance material.

15. The system of claim 12, wherein the readout device is configured to perform a resident time difference calculation and a power spectral density calculation.

16. The system of claim 12, wherein the second sensor further comprises a resistance to voltage circuit connected between the second collection mechanism and the elements of the second sensor.

17. The system of claim 12 further comprising a first input current mirror connected to the outputs of each of the first sensor elements and a second input current mirror connected to the outputs of each of the second sensor elements.

18. The system of claim 12, wherein the current input OTA is configured to input both alternating current and direct current, and wherein an element of the first sensor and an element of the second sensor are each configured to receive both a symmetrical and an asymmetrical input signal.

19. A system comprising:
    a first collection mechanism configured to convert an electric field into surface charge;
    a second collection mechanism comprising a magnetic reactive material;
    a first sensor connected to the first collection mechanism and a second sensor connected to the second collection mechanism, the first sensor and the second sensor comprising an odd number, greater than three, of unidirectionally-coupled non-linear over-damped bi-stable elements, wherein each element comprises a resistive load connected to an operational transconductance amplifier (OTA) with a bipolar junction transistor differential pair, a cross-coupled OTA, and a current input OTA configured to input both alternating current and direct current, wherein an element of the first sensor and an element of the second sensor are each configured to receive both a symmetrical and an asymmetrical input signal;
    a readout device connected to the first sensor and the second sensor, the readout device configured to perform a resident time difference calculation and a power spectral density calculation;
    a first input current mirror connected to the outputs of each of the first sensor elements; and
    a second input current mirror connected to the outputs of each of the second sensor elements.

* * * * *